(12) United States Patent
Yamanaka

(10) Patent No.: US 9,157,973 B2
(45) Date of Patent: Oct. 13, 2015

(54) MAGNETIC RESONANCE IMAGING APPARATUS

(75) Inventor: Masaaki Yamanaka, Otawara (JP)

(73) Assignees: KABUSHIKI KAISHA TOSHIBA, Tokyo (JP); TOSHIBA MEDICAL SYSTEMS CORPORATION, Otawara-Shi, Tochigi (JP)

( * ) Notice: Subject to any disclaimer, the term of this patent is extended or adjusted under 35 U.S.C. 154(b) by 608 days.

(21) Appl. No.: 13/412,665

(22) Filed: Mar. 6, 2012

(65) Prior Publication Data

US 2012/0229139 A1 Sep. 13, 2012

(30) Foreign Application Priority Data

Mar. 7, 2011 (JP) ................................ 2011-049310

(51) Int. Cl.
*G01R 33/34* (2006.01)
*G01R 33/385* (2006.01)

(52) U.S. Cl.
CPC .................................. *G01R 33/3852* (2013.01)

(58) Field of Classification Search
CPC ....................... G01R 33/3852; G01R 33/56518
USPC ........................... 324/300–322; 600/407–422
See application file for complete search history.

(56) References Cited

U.S. PATENT DOCUMENTS

| 4,585,995 A | 4/1986 | Flugan |  |
|---|---|---|---|
| 4,864,241 A * | 9/1989 | Goldie | ........................... 324/318 |
| 5,451,877 A | 9/1995 | Weissenberger | |
| 6,066,949 A | 5/2000 | Alley et al. | |
| 6,903,550 B2 * | 6/2005 | Uetake | ........................... 324/307 |
| 8,487,614 B2 * | 7/2013 | Kamata | ........................... 324/307 |
| 8,890,530 B2 * | 11/2014 | Umeda et al. | ................. 324/318 |
| 2009/0212772 A1 | 8/2009 | Ookawa | |
| 2012/0019251 A1 * | 1/2012 | Umeda et al. | ................. 324/322 |
| 2012/0098535 A1 * | 4/2012 | Kaneta et al. | ................. 324/307 |

FOREIGN PATENT DOCUMENTS

| CN | 1518949 A | 8/2004 |
|---|---|---|
| JP | 62-27932 | 2/1987 |
| JP | 04-022338 | 1/1992 |
| JP | 4-189344 | 7/1992 |
| JP | 05-269101 | 10/1993 |
| JP | 6-38942 A | 2/1994 |
| JP | 06-054820 | 3/1994 |

(Continued)

OTHER PUBLICATIONS

Office Action dated Jan. 22, 2014 in CN201210055807.6.

(Continued)

*Primary Examiner* — Melissa Koval
*Assistant Examiner* — Rishi Patel
(74) *Attorney, Agent, or Firm* — Nixon & Vanderhye P.C.

(57) ABSTRACT

A magnetic resonance imaging (MRI) apparatus storage unit stores different eddy current correction parameters that respectively correspond to different imaging positions to correct for influence of an eddy current magnetic field. An eddy current correcting unit receives the waveform of the gradient magnetic field calculated in accordance with an imaging condition, performs calculation onto the received waveform using an eddy current correction parameter selected in accordance with an imaging position, and outputs the calculation result as a corrected waveform to a gradient magnetic field power supply.

9 Claims, 8 Drawing Sheets

(56) References Cited

FOREIGN PATENT DOCUMENTS

| JP | 06-181905 | 7/1994 |
|---|---|---|
| JP | 10-272120 | 10/1998 |
| JP | 2000-262485 | 9/2000 |
| JP | 2001-112739 | 4/2001 |
| JP | 2001-258865 | 9/2001 |
| JP | 2004-261591 | 9/2004 |
| JP | 2005-288026 | 10/2005 |
| JP | 2009-172360 | 8/2009 |
| WO | 2010/143586 A1 | 12/2010 |

OTHER PUBLICATIONS

Office Action mailed Jul. 29, 2014, in JP 2011-049310 with English translation.
Office Action dated Sep. 9, 2014, in CN 201210055807.6.
Office Action mailed Feb. 10, 2015 in JP Patent Application No. 2011-049310.

\* cited by examiner

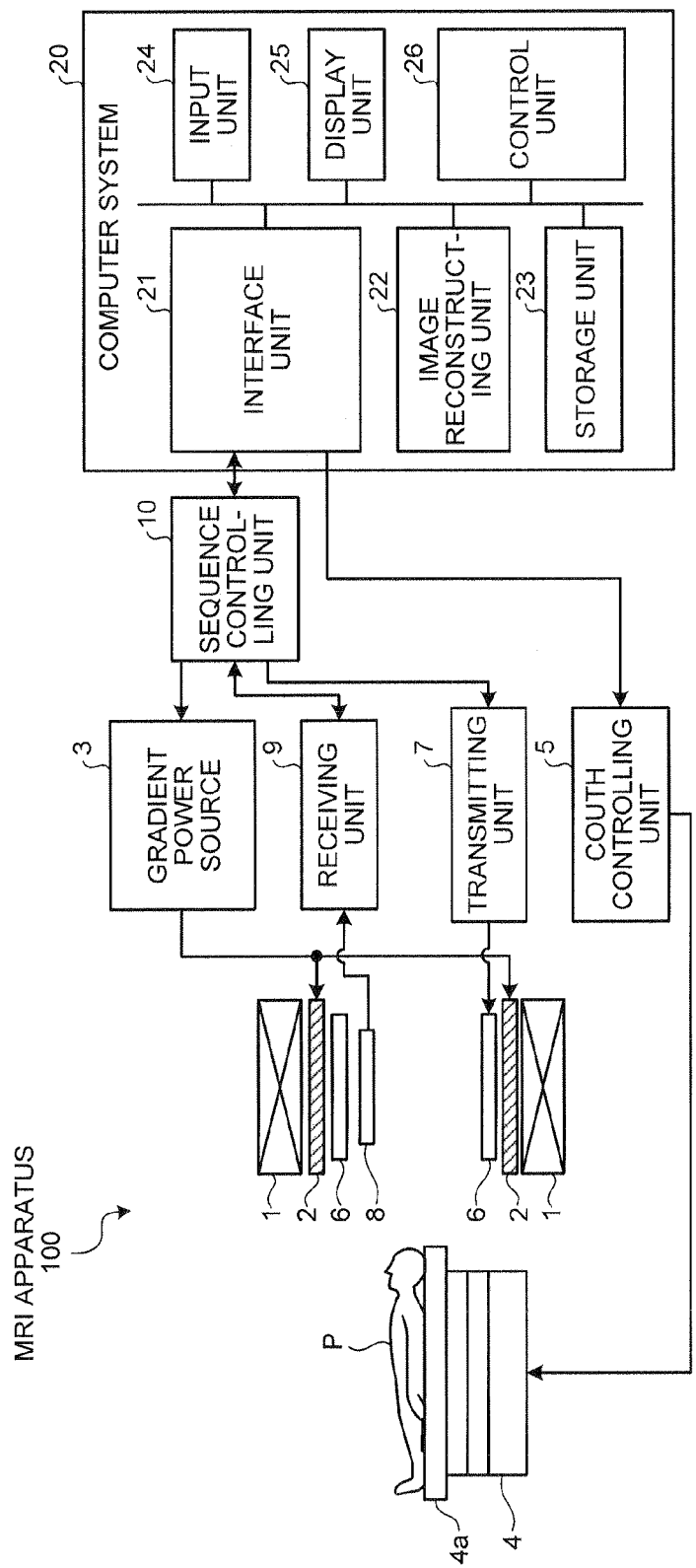

SHORT TIME CONSTANT    LONG TIME CONSTANT

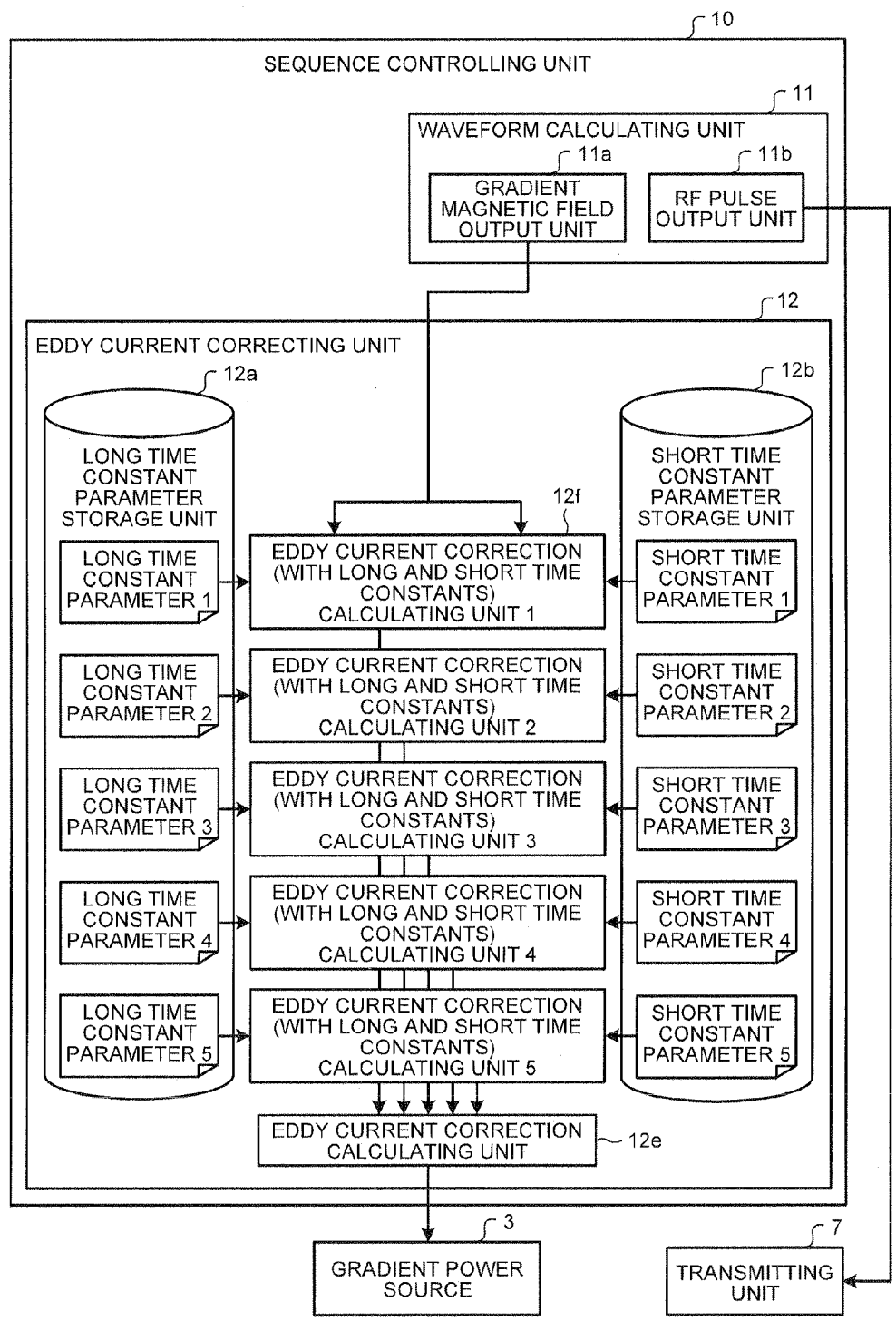

MAGNETIC RESONANCE IMAGING APPARATUS

CROSS-REFERENCE TO RELATED APPLICATIONS

This application is based upon and claims the benefit of priority from Japanese Patent Application No. 2011-049310, filed on Mar. 7, 2011; the entire contents of which are incorporated herein by reference.

FIELD

Embodiments described herein relate generally to a magnetic resonance imaging apparatus.

BACKGROUND

A magnetic resonance imaging apparatus adds positional information to a magnetic resonance signal emitted from a subject by applying a gradient magnetic field thereto, and reconstructs an image based on this positional information.

The magnetic resonance imaging apparatus applies a gradient magnetic field in pulse form. For this reason, an eddy current appears in conductive components arranged around the gradient coil (e.g., a heat shield for a magnetostatic magnet), and this eddy current generates a magnetic field (hereinafter, "eddy current magnetic field"). The eddy current magnetic field acts in a direction of suppressing the changes of the gradient magnetic field and deforms the waveform of the gradient magnetic field. Thus, corrections of the waveform need to be made in consideration of the influence of the eddy current magnetic field, or otherwise the image reconstructed from the magnetic resonance signals would be degraded. For this reason, eddy current correction has been employed to correct the waveform of the gradient magnetic field.

In the eddy current correction, calculation is performed by use of a predetermined eddy current correction parameter (intensity and time constant) with respect to an ideal waveform of the gradient magnetic field so that a corrected waveform can be output as the result. The gradient magnetic field power supply (hereinafter, "gradient power source") applies a gradient magnetic field in accordance with the corrected waveform. With the eddy current magnetic field overlapping the gradient field, the waveform of the gradient magnetic field becomes closer to the ideal waveform.

Here, the eddy current magnetic field may have a long time constant or a short time constant. It has been considered that an eddy current magnetic field with a long time constant is the one that causes image degradation. Because the eddy current magnetic field with a long time constant has substantially the same influence onto all the positions in the imaging range, an eddy current correction parameter is prepared with reference to the center of the magnetic field, and the correction is performed at all the positions with this parameter. However, a suitable correction may not always be performed for all the positions of the imaging range, and distortion or some other degradation may occur in the image, for example, at a position away from the center of the magnetic field.

BRIEF DESCRIPTION OF THE DRAWINGS

FIG. 1 is a block diagram for showing a structure of an MRI apparatus according to the first embodiment;

FIG. 9 is a block diagram for showing the structure of a sequence controlling unit according to the third embodiment.

DETAILED DESCRIPTION

First Embodiment

Figure 2A:
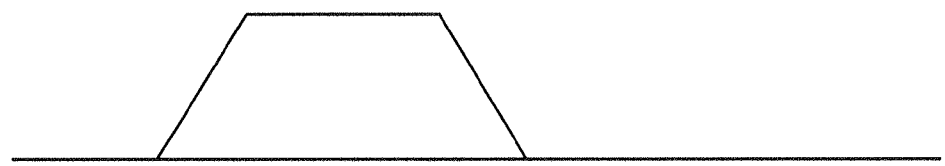
FIG. 2A is a diagram for explaining the influence of the eddy current magnetic field according to the first embodiment.

A magnetic resonance imaging (MRI) apparatus according to the present embodiments includes a storage unit, an eddy current correcting unit, and a gradient magnetic field power supply. The storage unit is configured to store therein eddy current correction parameters that each correspond to imaging positions to correct influence of an eddy current magnetic field. The eddy current correcting unit is configured to receive a waveform of a gradient magnetic field calculated in accordance with an imaging condition, perform calculation onto the waveform of the gradient magnetic field that is received by use of an eddy current correction parameter selected in accordance with the imaging position, and output a corrected waveform obtained as a result of the calculation to the gradient magnetic field power supply. The gradient magnetic field power supply is configured to receive the corrected waveform and apply the gradient magnetic field in accordance with the corrected waveform.

A MRI apparatus according to the first embodiment prepares an eddy current correction parameter for each imaging position, and corrects the waveform of the gradient magnetic field with reference to the position. In the following description, the structure of the MRI apparatus according to the first embodiment is briefly explained, and then the eddy current correction according to the first embodiment is explained in detail.

FIG. 1 is a block diagram for showing the structure of an MRI apparatus 100 according to the first embodiment. A magnetostatic magnet 1 is shaped into a hollow cylinder, and generates a magnetostatic field uniformly inside the hollow. The magnetostatic magnet 1 may be a permanent magnet or a superconducting magnet. A gradient coil 2 is shaped into a hollow cylinder and generates a gradient magnetic field inside the hollow. More specifically, the gradient coil 2 is arranged inside the magnetostatic magnet 1, and generates a gradient magnetic field with the supply of a current from a gradient power source 3. The gradient power source 3 supplies a current to the gradient coil 2 in accordance with a control signal transmitted from a sequence controlling unit 10.

A couch 4 is provided with a couchtop 4a on which a subject P lies, and the couchtop 4a with the subject P lying thereon is inserted into the hollow (imaging opening) of the gradient coil 2. Generally, the couch 4 is arranged with its longitudinal direction parallel to the central axis of the magnetostatic magnet 1. A couch controlling unit 5 drives the couch 4, and moves the couchtop 4a in the longitudinal direction and in the vertical direction.

A transmission coil 6 generates a high-frequency magnetic field. More specifically, the transmission coil 6 is arranged inside the gradient coil 2, and generates a high-frequency magnetic field in accordance with high-frequency pulses (radio frequency (RF) pulses) supplied from a transmitting unit 7. The transmitting unit 7 transmits the RF pulses corresponding to the Larmor frequency to the transmission coil 6, in accordance with a control signal transmitted from the sequence controlling unit 10.

A reception coil 8 receives a magnetic resonance signal (MR signal). More specifically, the reception coil 8 is arranged inside the gradient coil 2, and receives an MR signal emitted from the subject P under the influence of the high-frequency magnetic field. Moreover, the reception coil 8 outputs the received MR signal to a receiving unit 9.

The receiving unit 9 generates MR signal data based on the MR signal output from the reception coil 8, in accordance with pulse sequence execution data sent from the sequence controlling unit 10. More specifically, the receiving unit 9 converts the MR signal output by the reception coil 8 into digital form to generate MR signal data, and transmits the generated MR signal data to a computer system 20 by way of the sequence controlling unit 10.

The sequence controlling unit 10 controls the gradient power source 3, the transmitting unit 7, and the receiving unit 9. More specifically, the sequence controlling unit 10 transmits a control signal based on the pulse sequence execution data received from the computer system 20, to the gradient power source 3, the transmitting unit 7, and the receiving unit 9.

The computer system 20 includes an interface unit 21, an image reconstructing unit 22, a storage unit 23, an input unit 24, a display unit 25, and a control unit 26. The interface unit 21 is connected to the sequence controlling unit 10 to control the input/output of data exchanged between the sequence controlling unit 10 and the computer system 20. The image reconstructing unit 22 reconstructs image data from the MR signal data transmitted from the sequence controlling unit 10, and stores the reconstructed image data into the storage unit 23.

The storage unit 23 stores therein the image data entered by the image reconstructing unit 22 and other data used by the MRI apparatus 100. The storage unit 23 may be a semiconductor memory element such as a random access memory (RAM) and a flash memory, a hard disc, or an optical disc.

The input unit 24 receives an operation for determining an eddy current correction parameter, input of imaging conditions, imaging instructions, and the like from the operator. The input unit 24 may be a pointing device such as a mouse and a trackball, a selection device such as a mode switch, and an input device such as a keyboard. The display unit 25 displays image data and the like. The display unit 25 may be a display device such as a liquid crystal display.

The control unit 26 performs control onto the entire MRI apparatus 100 by controlling each of the above units. The control unit 26 may be an integrated circuit such as an application specific integrated circuit (ASIC) and a field programmable gate array (FPGA), or an electronic circuit such as a central processing unit (CPU) and a micro processing unit (MPU).

The processes from the reception of imaging conditions through the application of a gradient magnetic field are briefly explained now. According to the first embodiment, when receiving input of imaging conditions from the operator, the control unit 26 creates pulse sequence execution data in accordance with the received imaging conditions, and transmits the created pulse sequence execution data to the sequence controlling unit 10. Then, the sequence controlling unit 10 first generates a control signal to output the waveform of an ideal gradient magnetic field that suits the pulse sequence execution data. Next, the sequence controlling unit 10 conducts calculation for the waveform of the ideal gradient magnetic field by use of eddy current correction parameters, and obtains a waveform corrected as the calculation result. Then, the sequence controlling unit 10 transmits a control signal (e.g., the intensity and timing of the gradient field) for outputting the corrected waveform to the gradient power source 3. The gradient power source 3 applies a gradient magnetic field in accordance with this control signal.

Figure 2B:
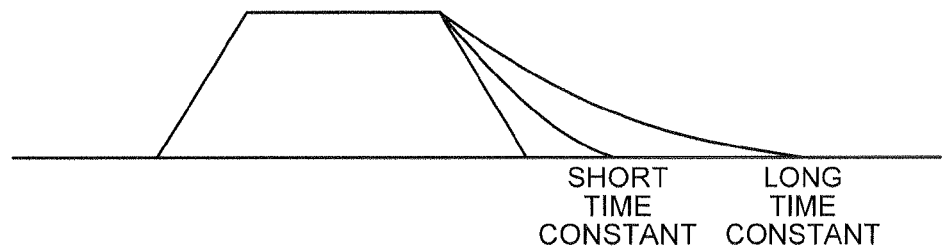
FIG. 2B is a diagram for explaining the influence of the eddy current magnetic field according to the first embodiment.

FIGS. 2A and 2B are diagrams for explaining the influence of the eddy current magnetic field according to the first embodiment. In FIG. 2A, an example waveform of an ideal gradient magnetic field that suits the pulse sequence execution data is shown. When the waveform of this ideal gradient magnetic field receives influence of an eddy current magnetic field, the waveform of the gradient field is distorted, as indicated in FIG. 2B, for example. In addition, there are two types in this distortion, as illustrated in FIG. 2B, one that receives the influence of an eddy current magnetic field whose time constant is long ("long time constant" in FIG. 2B) and one that receives the influence of an eddy current magnetic field whose time constant is short ("short time constant" in FIG. 2B).

Conventionally, it has been considered that the eddy current magnetic field that tends to degrade images is one that has a long time constant. The MRI apparatus 100 according to the first embodiment prepares different eddy current correction parameters for different positions to correct an eddy current magnetic field with a short time constant, and thereby makes corrections for each of the positions. The reason for this operation is briefly explained below. For example, with an eddy current correction parameter that is prepared with reference to the center of the magnetic field, suitable eddy current correction is not always performed for all the positions of the imaging range, and therefore the image is sometimes degraded at positions away from the center of the magnetic field. This contradicts the conventional idea that an eddy current magnetic field whose time constant is long (hereinafter, "long time constant") is the cause of the image degradation, and that the eddy current magnetic field with a long time constant has substantially the same influence on all the positions within the imaging range.

Furthermore, that phenomenon tends to become pronounced especially in a high-speed pulse sequence such as a fast spin echo (FSE) and a fast asymmetric spin echo (FASE). In a high-speed pulse sequence, the intensity of the gradient magnetic field is high and the time interval between the application of a gradient magnetic field and the collection of the MR signal is relatively short. If so, the MR signal seems to be collected before the influence of the eddy current magnetic field whose time constant is short (hereinafter, "short time constant") is cancelled, and therefore it can be presumed that an eddy current magnetic field with a short time constant exerts an influence over the MR signal. For this reason, the MRI apparatus 100 according to the first embodiment prepares different eddy current correction parameters for different positions for correcting the eddy current magnetic field with a short time constant, and makes corrections for each of the positions.

Figure 3:
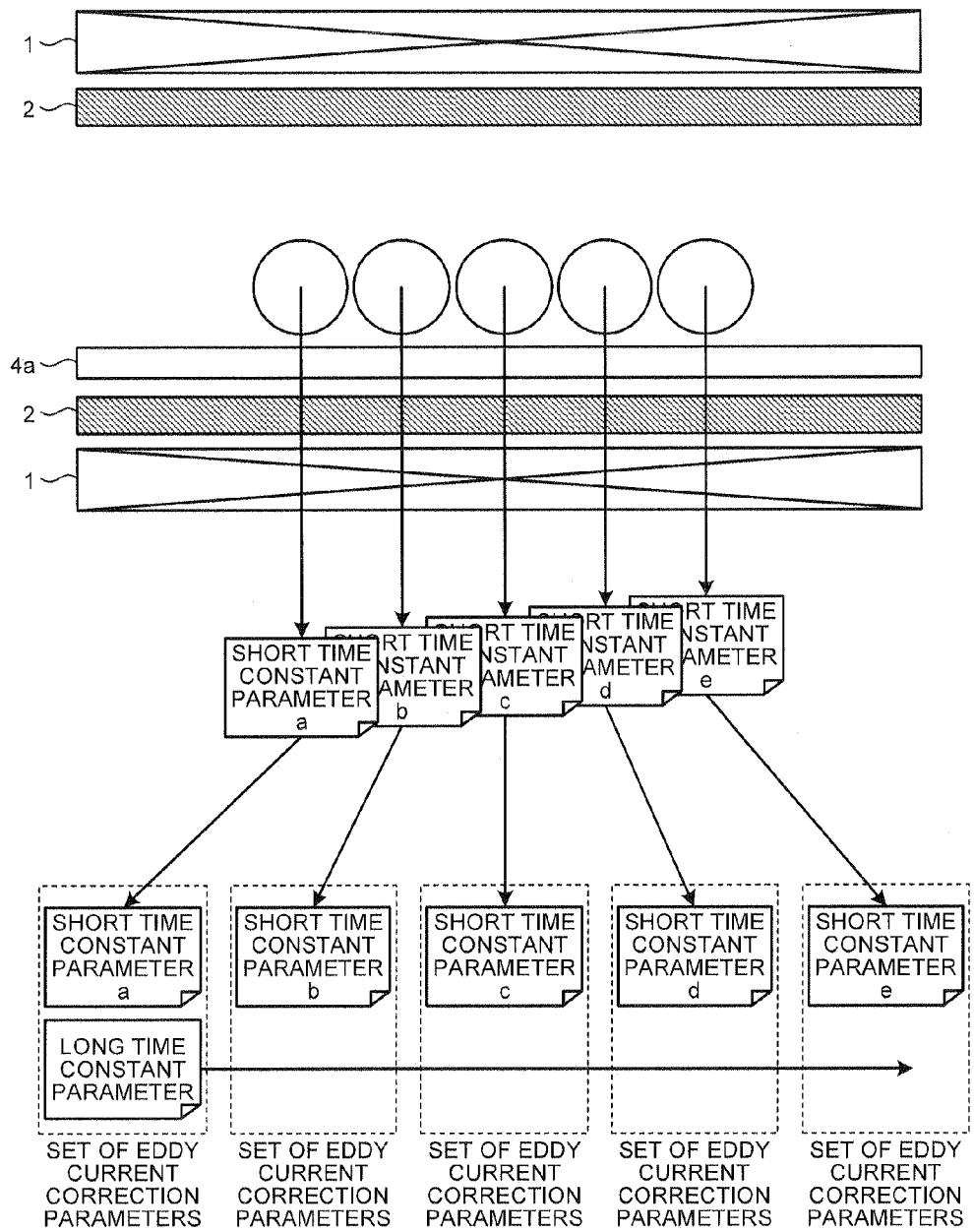
FIG. 3 is a diagram for explaining eddy current correction parameters according to the first embodiment.
Figure 4:
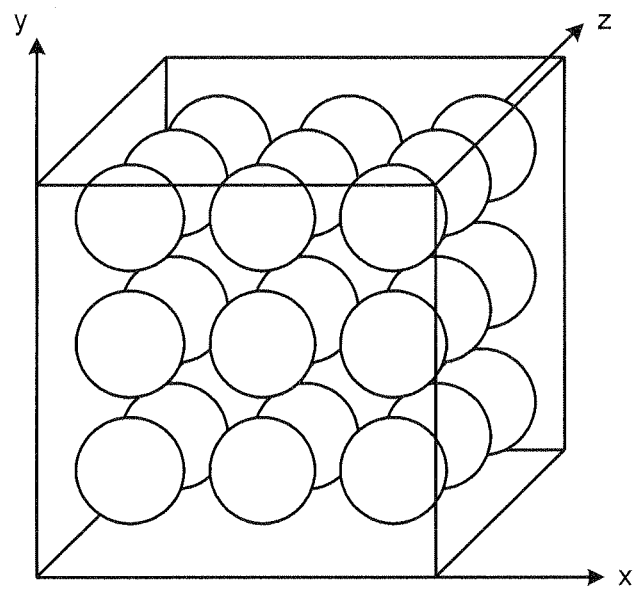
FIG. 4 is a diagram for explaining eddy current correction parameters according to the first embodiment.
Figure 5:
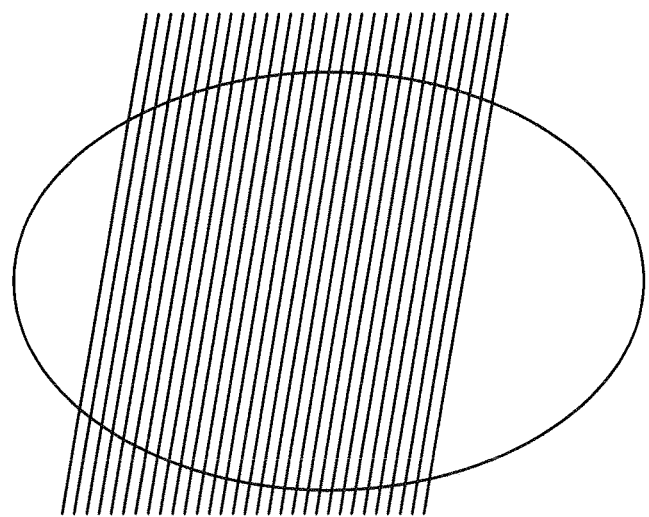
FIG. 5 is a diagram for explaining eddy current correction parameters according to the first embodiment.

FIGS. 3 to 5 are diagrams for explaining the eddy current correction parameters according to the first embodiment. The MRI apparatus 100 according to the first embodiment prepares eddy current correction parameters for different imaging positions in advance. For example, multiple phantoms are positioned on the couchtop 4a, as illustrated in FIG. 3, and this couchtop 4a is inserted into the opening of the gradient coil 2 to conduct test imaging with a typical pulse sequence. In this test imaging, eddy current corrections are tried with various eddy current correction parameters, and by measuring the influence on the collected MR signal and making adjustments, suitable eddy current correction parameters are determined.

For example, as illustrated in FIG. 3, multiple phantoms are arranged in the direction of the z-axis, images of the phantoms are sequentially taken, and trial eddy current corrections are performed with various eddy current correction parameters. An eddy current correction parameter with a short time constant is thereby determined for each of the phantom positions, for example. Short time constant parameters a to e, for example, are determined for the eddy current correction parameters with a short time constant.

On the other hand, according to the first embodiment, a single eddy current correction parameter with a long time constant is adopted for all the positions. For example, an eddy current correction parameter with a long time constant that is prepared with reference to the center of the magnetic field is adopted. As a result, the eddy current correction parameters for the imaging positions are obtained as a set of "the short time constant parameter a and the long time constant parameter (common)" to a set of "the short time constant parameter e and the long time constant parameter (common)", as indicated in FIG. 3.

In the above description, the phantoms are arranged in the direction of the z-axis, and an eddy current correction parameter with a short time constant is determined for each position in the direction of the z-axis. The embodiment is not limited thereto, however. For example, as indicated in FIG. 4, phantoms may be arranged in the directions of the x-axis and y-axis, and eddy current correction parameters with a short time constant may be determined for positions in the directions of the x-axis and y-axis as well as in the direction of the z-axis. In addition, as illustrated in FIG. 5, eddy current correction parameters with a short time constant may be determined in accordance with slices. Still further, eddy current correction parameters with a short time constant may be determined for lines included in the slices. In other words, theologically, an eddy current correction parameter can be determined in accordance with at least each unit of MR signal collection, and thus an eddy current correction parameter can be determined for each position of this arbitrarily determined unit.

Figure 6:
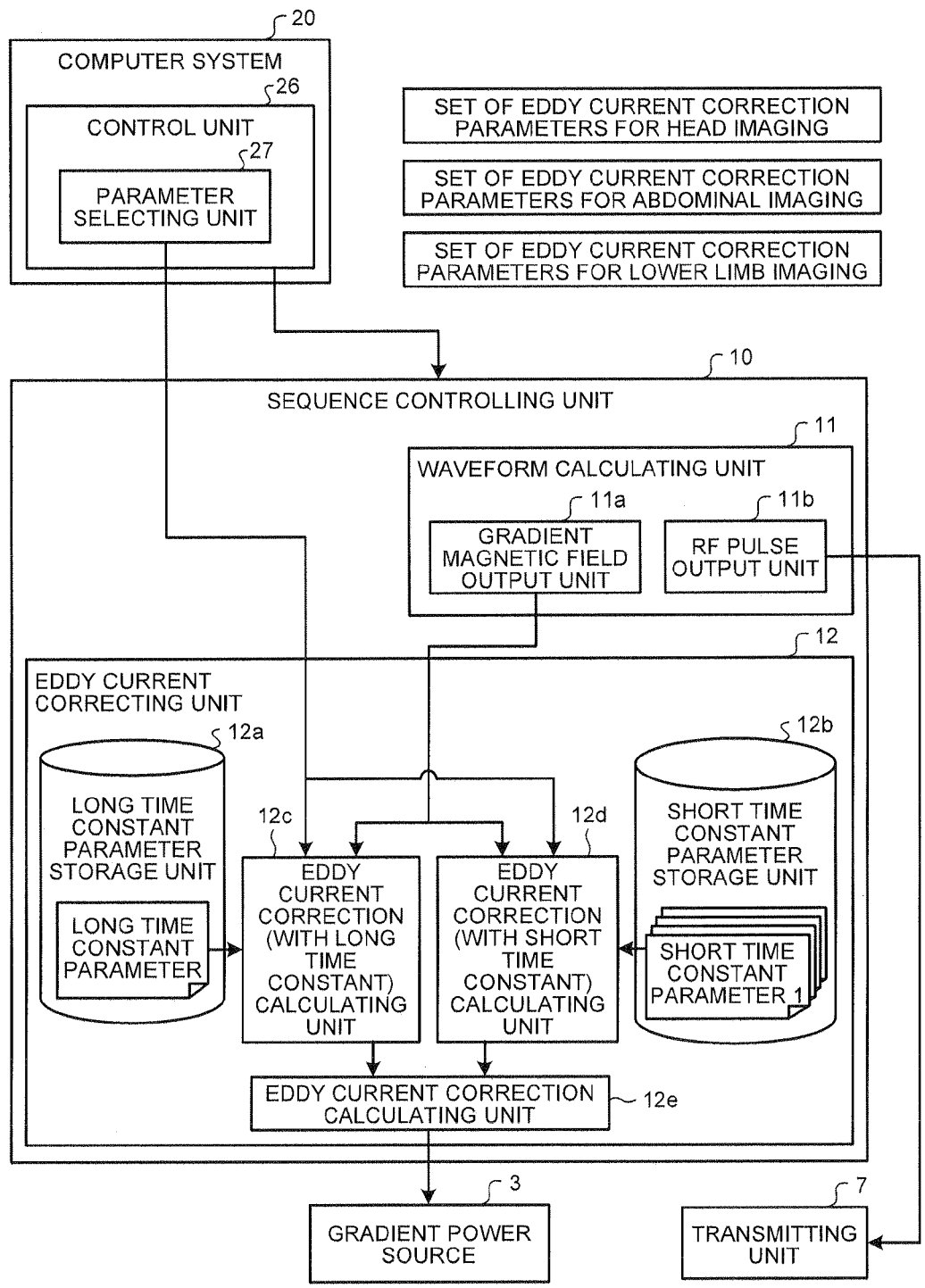
FIG. 6 is a block diagram for showing a structure of a sequence controlling unit according to the first embodiment.

FIG. 6 is a block diagram for showing the structure of a sequence controlling unit 10 according to the first embodiment. When receiving the pulse sequence execution data from the computer system 20, an RF pulse output unit 11b generates a control signal for outputting an RF pulse based on this pulse sequence execution data, and transmits the generated control signal to the transmitting unit 7.

When receiving pulse sequence execution data from the computer system 20, a gradient magnetic field output unit 11a generates control signals (e.g., intensity and timing of the gradient magnetic field) based on this pulse sequence execution data to output an ideal waveform, and sequentially transmits the generated control signals to an eddy current correction (with long time constant) calculating unit 12c and an eddy current correction (with short time constant) calculating unit 12d.

A long time constant parameter storage unit 12a stores therein a long time constant parameter prepared in advance. According to the first embodiment, a single eddy current correction parameter with a long time constant is adopted for all the positions. On the other hand, a short time constant parameter storage unit 12b stores therein short time constant parameters prepared in advance for the positions in the imaging range. For example, the short time constant parameter storage unit 12b may store therein short time constant parameters 1 to 5.

When receiving a control signal for outputting an ideal waveform from the gradient magnetic field output unit 11a, the eddy current correction (with long time constant) calculating unit 12c reads the long time constant parameter from the long time constant parameter storage unit 12a, and performs calculation by use of the read-out long time constant parameter. More specifically, the eddy current correction (with long time constant) calculating unit 12c generates a control signal for outputting a corrected waveform by performing calculation for an ideal waveform of the gradient magnetic field by use of the long time constant parameter. Then, the eddy current correction (with long time constant) calculating unit 12c transmits the generated control signal, or in other words, the control signal for outputting the corrected waveform, to an eddy current correction calculating unit 12e.

The long time constant parameter includes the intensity and the time constant, and the calculation for correction is performed by use of the intensity and the time constant. Furthermore, the calculation for the correction is realized with a conventional technology.

On the other hand, when receiving a control signal for outputting an ideal waveform from the gradient magnetic field output unit 11a, the eddy current correction (with short time constant) calculating unit 12d selects, from among the short time constant parameters stored in the short time constant parameter storage unit 12b, a short time constant parameter that corresponds to the position of the imaging target, and reads the selected short time constant parameter. For example, the eddy current correction (with short time constant) calculating unit 12d selects a short time constant parameter 1 for the first time of repetition (TR), or a short time constant parameter 5 for the fifth TR. Then, the eddy current correction (with short time constant) calculating unit 12d performs calculation by use of the read-out short time constant parameter. More specifically, the eddy current correction (with short time constant) calculating unit 12d performs calculation for an ideal waveform of the gradient magnetic field by use of the short time constant parameter so that a control signal for outputting a corrected waveform can be generated. Then, the eddy current correction (with short time constant) calculating unit 12d transmits the generated control signal, or in other words, the control signal for outputting the corrected waveform, to the eddy current correction calculating unit 12e.

A short time constant parameter includes the intensity and the time constant, and the calculation for correction is performed by use of the intensity and the time constant. Furthermore, the calculation for this correction is realized in accordance with a conventional technology.

When receiving control signals from the eddy current correction (with long time constant) calculating unit 12c and also from the eddy current correction (with short time constant) calculating unit 12d, the eddy current correction calculating unit 12e combines these signals to generate the final control signal for outputting a corrected waveform. Then, the eddy current correction calculating unit 12e transmits the final control signal to the gradient power source 3. As a result, the gradient power source 3 applies a gradient magnetic field that suits the corrected waveform, based on the control signal.

Here, the control signal for outputting an ideal waveform is transmitted sequentially from the gradient magnetic field output unit 11a to the eddy current correction (with long time constant) calculating unit 12c and the eddy current correction (with short time constant) calculating unit 12d. As a result, the eddy current correction (with long time constant) calculating unit 12c and the eddy current correction (with short time constant) calculating unit 12d sequentially perform calculations by use of the long time constant parameter and the short time constant parameters, respectively, and sequentially transmit the control signals for outputting the corrected waveform to the eddy current correction calculating unit 12e. The eddy current correction calculating unit 12e therefore also sequentially generates the final control signal, and sequentially transmits it to the gradient power source 3. In other words, the processes up to outputting a control signal from the gradient magnetic field output unit 11a and applying a gradient magnetic field from the applying gradient power source 3 are conducted in real time.

The reason for performing the processes in real time is explained below. Because control signals for outputting the waveform of a gradient magnetic field usually differ depending on the imaging conditions, these signals are often generated after the test is started. However, because a massive amount has to be prepared, control signals are not usually prepared between the start of the test and the start of the imaging from the aspect of implementation. This is because it would take long to start imaging after the test is started. For this reason, if there is no problem in the implementation, the processes do not have to be performed in real time.

In FIG. 3, for each position, a set of a long time constant parameter and a short time constant parameter prepared for each imaging position is referred to as a "set of eddy current correction parameters". According to the first embodiment, sets of eddy current correction parameters for different positions are maintained in a mass. The examples include "a set of eddy current correction parameters for head imaging", "a set of eddy current correction parameters for abdominal imaging", and "a set of eddy current correction parameters for lower limb imaging", as indicated in FIG. 6.

A parameter selecting unit 27 of the control unit 26 selects a set of eddy current correction parameters classified in advance in accordance with the imaging conditions, based on the imaging conditions input by the operator. For example, the parameter selecting unit 27 determines from the imaging conditions that the imaging to be executed is for the head region, and therefore selects a set of eddy current correction parameters for head imaging. Then, the parameter selecting unit 27 transmits a control signal to the eddy current correction (with long time constant) calculating unit 12c and the eddy current correction (with short time constant) calculating unit 12d to inform that the set of eddy current correction parameters for head imaging should be used. When receiving this control signal, the eddy current correction (with long time constant) calculating unit 12c and the eddy current correction (with short time constant) calculating unit 12d select the set of eddy current correction parameters for head imaging, and use the eddy current correction parameters included in this set of eddy current correction parameters for head imaging to perform the calculation for the eddy current correction. The classification of sets of eddy current correction parameters is not limited thereto, and the sets may be classified in accordance with types of pulse sequences. The selected set of eddy current correction parameters may be received directly from the operator.

Figure 7:
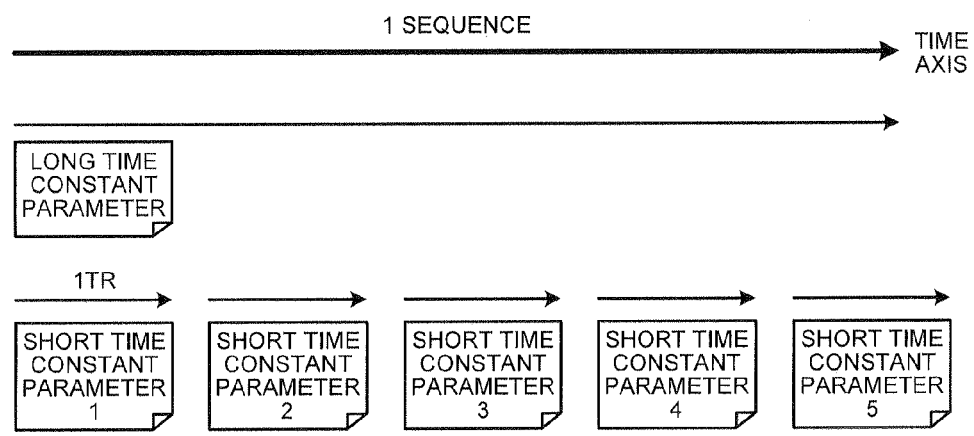
FIG. 7 is a diagram for explaining an application to a pulse sequence according to the first embodiment.

FIG. 7 is a diagram for explaining adoption of the above parameters in a pulse sequence according to the first embodiment. In FIG. 7, one sequence contains 5 TRs, for example. Whether one slice or one line is imaged in one TR is determined in accordance with the type of pulse sequence. In either case, if the imaging position changes in accordance with a TR, and if short time constant parameters are prepared in the same unit as that of TR, short time constant parameters determined for different TRs are adopted, as indicated in FIG. 7.

For example, short time constant parameters are prepared in accordance with slices, and a pulse sequence indicates imaging for one slice in 1TR. In such a situation, the eddy current correction (with short time constant) calculating unit 12d should select a short time constant parameter for each TR in accordance with the position of the corresponding slice. Furthermore, the short time constant parameter that has been selected may be reselected in the same sequence. Because there is some interval between TRs, it is considered that the correction performed in one TR with a short time constant parameter would have very little influence onto the gradient magnetic field of the next TR. In other words, different short time constant parameters can be adopted for different TRs.

As explained above, according to the first embodiment, an eddy current correction parameter with a short time constant is prepared for each of the imaging positions, and the waveform of the gradient magnetic field is corrected in accordance with the positions so that the eddy current correction can be suitably performed. For example, the eddy current correction can be suitably conducted at imaging positions away from the center of the magnetic field, and therefore image degradation can be suppressed, and a stable image can be obtained.

Second Embodiment

Figure 8:
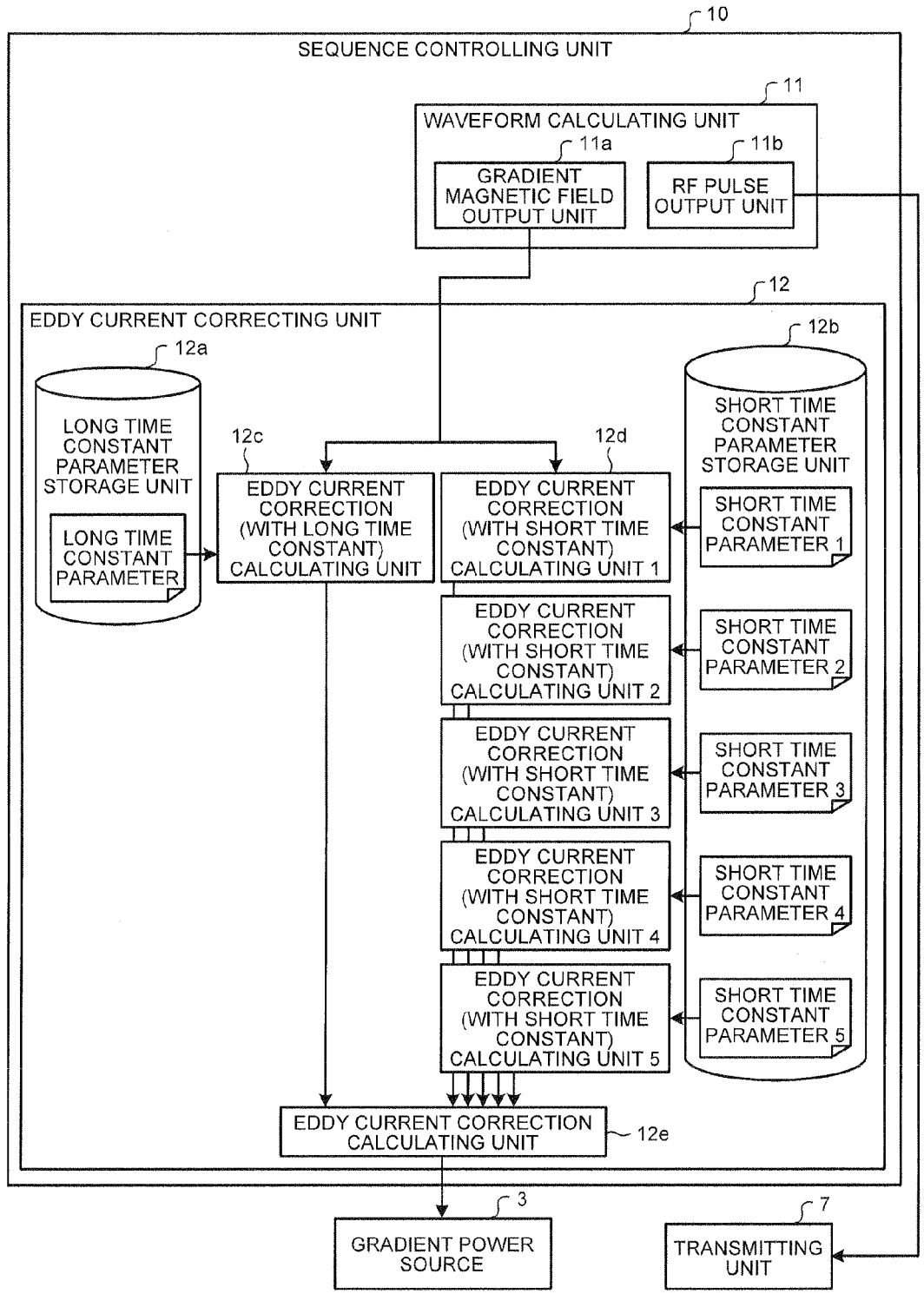
FIG. 8 is a block diagram for showing the structure of a sequence controlling unit according to the second embodiment.

The MRI apparatus 100 according to the second embodiment has the same structure as that of the first embodiment except for the features specified below. FIG. 8 is a block diagram for showing the structure of the sequence controlling unit 10 according to the second embodiment.

As illustrated in FIG. 8, in the sequence controlling unit 10 according to the second embodiment, an eddy current correcting unit 12 includes multiple eddy current correction (with short time constant) calculating units 12d that correspond to the short time constant parameters. Then, each of the eddy current correction (with short time constant) calculating units 12d individually perform the calculation by use of the corresponding one of the short time constant parameters.

According to the first embodiment, the calculation by the eddy current correction (with short time constant) calculating unit 12d is started after a control signal for outputting an ideal waveform is received from the gradient magnetic field output unit 11a and a short time constant parameter is selected. In such a case, the time interval between the reception of the control signal for outputting an ideal waveform and the generation of a control signal after the correction becomes long.

In contrast, according to the second embodiment, the eddy current correction (with short time constant) calculating units 12d continuously perform calculations by use of the corresponding short time constant parameters, and continuously output the calculation results. For example, as indicated in FIG. 7, if one sequence contains 5 TRs, it is assumed that the waveforms of the ideal gradient magnetic field for different TRs are the same. On the other hand, the imaging positions differ in accordance with the TRs, and therefore different short time constant parameters are adopted for the eddy current correction.

When the first 1TR is executed, each of the eddy current correction (with short time constant) calculating units 12d learns the waveform of an ideal gradient magnetic field for 1TR. Thus, for example, during the execution of the first 1TR, the eddy current correction (with short time constant) calculating unit 12d corresponding to the short time constant parameter 2 performs calculation by use of the short time constant parameter 2 in advance to generate a control signal. In the same manner, for example, during the execution of the first 1TR, the eddy current correction (with short time constant) calculating unit 12d corresponding to the short time constant parameter 3 also performs calculation by use of the short time constant parameter 3 in advance to generate a control signal. The eddy current correction (with long time constant) calculating units 12d are configured to hold the calculation results that have been obtained during the first 1TR at least after the second 1TR and subsequent ones.

With such parallel calculations, the length of time between the reception of the control signal for outputting the ideal waveform and the generation of the control signal after the correction can be significantly reduced, and thereby the processing time required by the eddy current correcting unit 12 can be reduced. Even if the idle time between a 1TR and another 1TR is short, these calculations are still applicable.

It has been explained that the eddy current correcting unit 12 according to the second embodiment has the same number of eddy current correction (with short time constant) calculating units 12d as that of short time constant parameters. However, the present embodiment is not limited thereto. Even if it does not have the same number of eddy current correction (with short time constant) calculating units 12d as that of short time constant parameters, two eddy current correction (with short time constant) calculating units 12d, for example, may conduct calculations for the next TR and hold the calculation results in advance.

As discussed above, according to the second embodiment, the eddy current correcting unit 12 is provided with multiple eddy current correction (with short time constant) calculating units 12d to each correspond to the short time constant parameters, and each of the eddy current correction (with short time constant) calculating units 12d individually perform the calculations by use of the corresponding short time constant parameters. Hence, the processing time can be significantly reduced.

Third Embodiment

The MRI apparatus 100 according to the third embodiment has the same structure as that of the first embodiment, except for the features specified below. FIG. 9 is a block diagram for showing the structure of the sequence controlling unit 10 according to the third embodiment.

As illustrated in FIG. 9, the sequence controlling unit 10 according to the third embodiment stores a long time constant parameter for each imaging position into the long time constant parameter storage unit 12a. In other words, according to the first and second embodiments, a single eddy current correction parameter with a long time constant is shared for all the positions. According to the third embodiment, different eddy current correction parameters with a long time constant are adopted for different imaging positions.

As described above, it is considered in general that an eddy current magnetic field with a long time constant exerts influence substantially equally on all the positions of the imaging range. It is not exactly the same influence, however, and the accuracy of the eddy current correction is expected to be improved by adopting different long time constant parameters for different positions.

Thus, in the sequence controlling unit 10 according to the third embodiment, the eddy current correcting unit 12 is provided with multiple eddy current correction calculating units 12f that each correspond to the long time constant parameters. According to the third embodiment, it is assumed that, as illustrated in FIG. 9, the calculations are conducted in accordance with a short time constant parameter and with a long time constant parameter by one of the eddy current correction calculating units 12f. Each of the eddy current correction (with long and short time constants) calculating units 12f performs calculations in accordance with a short time constant parameter and a long time constant parameter for the same position. The present embodiment, however, is not limited thereto, and the eddy current correcting unit 12 may be configured with multiple eddy current correction calculating units 12f for short time constant parameters and multiple eddy current correction calculating units 12f for long time constant parameters, separately.

As described above, according to the third embodiment, an eddy current correction parameter with a long time constant may be prepared for each imaging position, and the waveform of the gradient magnetic field is corrected in accordance with the position. Hence, the eddy current correction can be conducted with still higher accuracy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus comprising:
   a storage unit configured to store therein plural first correction parameters that each correspond to a respective one of plural imaging positions to correct for influence of an eddy current magnetic field with a short time constant, and to store therein a common second correction parameter for all the positions to correct for influence of an eddy current magnetic field with a long time constant;
   an eddy current correcting unit configured to (a) receive a gradient magnetic field waveform calculated in accordance with an imaging condition, (b) perform calculation onto the waveform by use of a first correction parameter selected in accordance with an imaging position and the second correction parameter, and (c) output a corrected waveform, obtained as a result of the calculation, to a gradient magnetic field power supply; and
   wherein the gradient magnetic field power supply is configured to receive the corrected waveform and to apply a gradient magnetic field in accordance with the corrected waveform.

2. The magnetic resonance imaging apparatus according to claim 1, wherein:
   a plurality of eddy current correcting units are provided, each correcting unit corresponding to a respective one of the first correction parameters; and each of the eddy current correcting units performs calculation individually by use of a corresponding one of the first correction parameters.

3. The magnetic resonance imaging apparatus according to claim 1, further comprising:
   a selecting unit configured to select, based on the imaging condition, a set of eddy current correction parameters classified in advance in accordance with the imaging condition,
   wherein the eddy current correcting unit selects an eddy current correction parameter that corresponds to the imaging position from the selected set of eddy current correction parameters to perform the calculation.

4. The magnetic resonance imaging apparatus according to claim 2, further comprising:
   a selecting unit configured to select, based on the imaging condition, a set of eddy current correction parameters classified in advance in accordance with the imaging condition,
   wherein the eddy current correcting unit selects an eddy current correction parameter that corresponds to the imaging position from the selected set of eddy current correction parameters to perform the calculation.

5. The magnetic resonance imaging apparatus according to claim 1, further comprising:
   a selecting unit configured to select, based on a type of an MRI pulse sequence, a set of eddy current correction parameters previously classified in accordance with different types of MRI pulse sequences,
   wherein the eddy current correcting unit selects an eddy current correction parameter that corresponds to an imaging position from the selected set of eddy current correction parameters to perform the calculation.

6. The magnetic resonance imaging apparatus according to claim 5, wherein:
   a plurality of eddy current correcting units are provided with each such correcting unit corresponding to a respective eddy current correction parameter; and
   each of the eddy current correcting units performs calculation individually using a respectively corresponding one of the eddy current correction parameters.

7. The magnetic resonance imaging apparatus according to claim 1,
   wherein the eddy current correcting unit (i) performs, during a first time of repetition (TR) interval of a pulse sequence, calculation for a second TR interval that is to be executed after the first TR interval in the pulse sequence, and (ii) holds a result of the calculation in advance of it being needed for use during the second TR interval.

8. The magnetic resonance imaging apparatus according to claim 7, wherein:
   a plurality of eddy current correcting units are provided with each such correcting unit corresponding to a respective eddy current correction parameter; and
   each of the eddy current correcting units performs calculation individually using a respectively corresponding one of the eddy current correction parameters.

9. The magnetic resonance imaging apparatus according to claim 7, further comprising:
   a selecting unit configured to select, based on the imaging condition, a set of eddy current correction parameters previously classified in accordance with the imaging condition, and
   wherein the eddy current correcting unit selects an eddy current correction parameter that corresponds to the imaging position from the selected set of eddy current correction parameters to perform the calculation.

* * * * *